United States Patent [19]
Klossika

[11] 3,787,966
[45] Jan. 29, 1974

[54] METHOD OF CONNECTING A CONTACTING WIRE TO A METAL CONTACT ON THE SURFACE OF A SEMICONDUCTOR ELEMENT

[75] Inventor: Walter Klossika, Heilbronn, Germany

[73] Assignee: Licentia Patent-Verwaltungs-G.m.b.H., Frankfurt am Main, Germany

[22] Filed: Jan. 21, 1972

[21] Appl. No.: 219,664

[30] Foreign Application Priority Data
Jan. 29, 1971 Germany .................. P 21 04 207.9

[52] U.S. Cl. .................... 29/628, 29/471.3, 29/482, 29/488, 29/493, 228/5, 228/15

[51] Int. Cl. ............................................ H05k 3/00

[58] Field of Search ..... 29/475, 482, 493, 628, 488, 29/497.5, 471.3; 228/5, 15

[56] References Cited
UNITED STATES PATENTS 3,087,239 4/1963 Clagett ............................ 29/475 X
3,328,875 7/1967 Pennings .......................... 29/475 X

*Primary Examiner*—Richard B. Lazarus
*Attorney, Agent, or Firm*—Harvey Kaye et al.

[57] ABSTRACT

A method of connecting a contacting wire to a metal contact on the surface of a semi conductor element comprises heating the semiconductor element, retaining one end of a wire with an oxidized surface on a contact point of the metal contact, stretching the wire and simultaneously pressing the wire against the contact point and kinking the wire of this point.

5 Claims, 3 Drawing Figures

METHOD OF CONNECTING A CONTACTING WIRE TO A METAL CONTACT ON THE SURFACE OF A SEMICONDUCTOR ELEMENT

BACKGROUND OF THE INVENTION

The invention relates to a method of connecting a contacting wire with a contact point on the surface of a semiconductor body by means of thermo-compression.

Contacts of semiconductor elements are normally connected electrically with the leads of a housing by means of the known thermocompression welding method. Generally, the contacts consist of conductor paths, extending over the insulating layer covering the surface of the semi-conductor. For thermo-compression, a contacting wire is pressed under pressure against the contact point of a heated semiconductor element. This combination of pressure and heat provides firm joints between the connecting wires and the contacts of the semiconductor element. The thermo-compression method is performed in a variety of ways. In one such process, the end of the wire is melted to form a sphere and this is pressed with the pointed end of the wire feed capillary against the contact surface of the semi-conductor. Thermo-compression is particularly suitable for connecting gold wires to metal conductor paths. It is used particularly for contacting semiconductor elements which are not subjected to ambient temperatures of more than 200°C during operation.

Recently, however, elements are required at an increasing degree which must withstand ambient temperature of more than 200°C in widely varying fields of application. At continuous temperature loadings of above 200°C, the conventional gold-aluminum thermo-compression joints disintegrate and the electrical connection is destroyed. This undesirable effect is often referred to as purple boundary. In order to avoid this erosion phenomenon, aluminum contacts are contacted with aluminum wires. However, this has the difficulty that immediately after the cleaning etching, aluminum wires are coated with a stable oxide skin which must be torn off sufficiently during the welding.

This problem does not occur with aluminum contacts on a semiconductor element, because the thickness is usually below 1 $\mu$m. In this case, the oxide skin on the contacts has only a thickness of 10 – 20 layers of molecules and is unimportant during the thermo-compression on the connecting point. On the other hand, the contacting wires have a thickness of 30 – 50 $\mu$ and are covered with an oxide skin of such thickness that normal thermo-compression becomes impossible.

In order to destroy the oxidizing effectively during the contacting, aluminum contacting wires have hitherto been connected with the associated contacts by means of ultrasonics. However, the accurate metering of the ultrasonic energy required is extremely difficult, because even very small mechanical instabilities on the ultrasonic transmission path result in strong fluctuations of the effective ultrasonic energy. Thus, the welded joint frequently receives too much or too little ultrasonic energy. The consequence are burnt connections or joints with insufficient mechanical strength.

The defined application of ultrasonic energy is particularly difficult with semiconductor elements, of which many are soldered on strip-shaped metal contacting strips. The contacts of these elements are connected by thin wires with tongues or rungs of these contacting strips. After casting these elements in plastics, the sheet metal parts of the strips, connecting the contacting rungs or contacting tongues, are cut off, forming thereby elements with electrically separated electrode leads.

SUMMARY OF THE INVENTION

It is an object of the invention to provide a contacting method, whereby, to the exclusion of the ultrasonic welding method, wires, having a stable oxide layer on their surface, may be connected with associated contacting points of a semiconductor element. This method should be suitable particularly also for elements, constructed in accordance with the strip method, and mounted in plastics.

According to the invention, there is provided a method of connecting a contacting wire to a metal contact on the surface of a semiconductor element comprising the steps of heating said semiconductor element, retaining one end of contacting wire with an oxidised surface in the region of a contact point of said metal contact, stretching the wire and simultaneously pressing said wire against said contact point of said semiconductor element and kinking said wire by means of a tool at said contact point.

BRIEF DESCRIPTION OF THE DRAWINGS

The invention will now be described in greater detail, by way of example, with reference to the accompanying drawings, in which.

DESCRIPTION OF THE PREFERRED EMBODIMENT

Figures 1, 3:
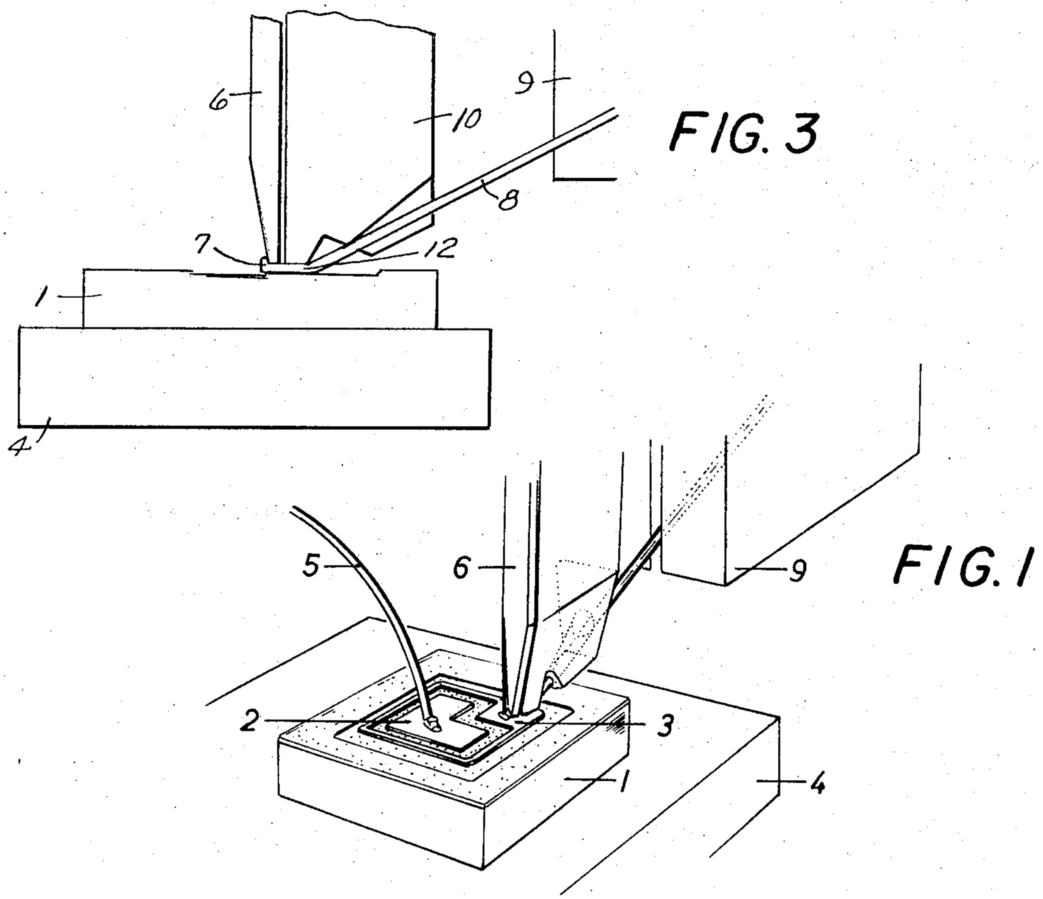
FIG. 1 is a perspective view of a contacting device immediately prior to the production of a thermo-compression joint according to the method of the invention.
FIGS. 2 and 3 are side views of the device of FIG. 1, depicting different phases of the operation.
Figure 2:
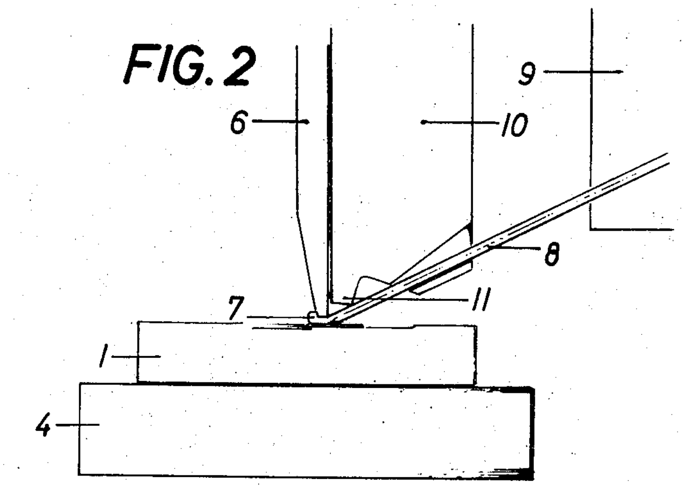

The invention proposes that for connecting a contacting wire to a metal contact arranged on the surface of a semi-conductor body by thermo-compression, one end of the contacting wire made of metal with oxidized surface, is held in the zone of the contact point, then the wire is tensioned with a defined tensile force and is simultaneously kinked with a suitable tool, and this kinked part is pressed against the contacting point of the heated semiconductor element.

In this method, the originally unstressed wire is stretched at the kinking point, because here a bending stress occurs in addition to the elongation. For this reason, the oxide skin is torn at the kinking point, enabling a mechanically durable thermocompression joint to be made at this point.

Referring now to the drawings, the semiconductor element 1 shown by way of example, is a transistor, the base and emitter zones of which are provided on one surface of the semiconductor element with aluminum connecting contacts 2 and 3. The collector zone is connected on the other surface with a strip-shaped carrier firmly electrically and mechanically. To this end, the semiconductor element is preferably soldered to the carrier body 4.

The carrier body 4 is heated in such a way that the semiconductor element has a temperature of about 300°C. The base contact 2 is already connected with a contacting wire 5, whilst during the stage shown, the emitter contact is just being made. To this end, the angled end 7 of the contacting wire 8 is fitted to the metal contact 3, consisting preferably of aluminum, by means of a hold-down blade 6 which thus clamps a portion of the wire to the semiconductor. The wire extends obliquely to the semiconductor surface and is held by pliers 9. Immediately behind the holding blade 6 rests under its own weight the pressure blade 10, through which the contacting wire partially passes. Immediately above the contact point, the contacting blade 10 has a tapering "nose" 11 with blunt point, whereby the contacting wire is pressed onto the contacting point as the contacting blade 10 is pressed down (FIG. 3). By means of the pliers 9, a pulsating tensile force is simultaneously brought to act on the wire 8, for example, with a force of 1.7 grams, stretching the wire. Since the wire extends at an angle to the surface of the element, it is bent (or kinked) by and about the "nose" 11 as the contacting blade 10 moves downwardly and then the bent or kinked portion 12 is pressed against the contact point. Thus, in addition to the tension, the kinked portion is also subjected to a bending force so that the wire is particularly strongly stretched at this point. Under the action of both these forces, the oxide skin is torn immediately before the application of the wire to the contact point by the pressure blade 10 so that the oxide-free end of the wire may be mounted on the associated contact point mechanically firmly and durably.

After contacting the wire with the semiconductor element, the wire is connected in a like manner with a conductor element of the housing. Then, the wire is preferably cut in such a manner that the wire end offers again an angled portion which is pressed by the holding-down blade on the next contact point.

It will be understood that the above description of the present invention is susceptible to various modification changes and adaptations.

What is claimed is:

1. A method of connecting a contacting wire to a metal contact on the surface of a semiconductor element, said contacting wire having an oxide skin, comprising the following steps in combination:

a. heating said semiconductor element;
b. clamping a first portion of said wire to said semiconductor in the region of a contact area of said metal contact;
c. bending a second portion of said wire, said second portion being adjacent said first portion;
d. simultaneously with said bending step, applying a tensile force to said wire, whereby said second portion is stretched and the oxide skin on said second portion is torn; and
e. pressing said stretched second portion against said contact area for effecting a thermo-compression joint with said metal contact of said semiconductor.

2. A method as defined in claim 1, further comprising using aluminum contact wires to contact an aluminum contact on said surface of said semiconductor body.

3. A method as defined in claim 6, wherein said first portion of said contact wire is held at said contact area by a hold-down blade so that said wire extends obliquely to a tangent of said surface passing through any point of said contact area, said wire is stretched and simultaneously bent by means of a second blade behind said hold-down blade and the bent portion of said wire is applied under pressure to said contact area to produce a thermo-compression joint.

4. A method as defined in claim 1, said heating step comprising heating said semiconductor element to about 300°C.

5. A method as defined in claim 1, wherein said tensile force is a pulsating tensile force.

* * * * *